United States Patent
Liu et al.

(10) Patent No.: US 8,231,727 B2
(45) Date of Patent: Jul. 31, 2012

(54) CRYSTAL GROWTH APPARATUS AND METHOD

(75) Inventors: Weiguo Liu, San Leandro, CA (US); A. Grant Elliot, Palo Alto, CA (US)

(73) Assignee: AXT, Inc., Fremont, CA (US)

( * ) Notice: Subject to any disclaimer, the term of this patent is extended or adjusted under 35 U.S.C. 154(b) by 1017 days.

(21) Appl. No.: 12/104,443

(22) Filed: Apr. 17, 2008

(65) Prior Publication Data
US 2009/0249994 A1 Oct. 8, 2009

(30) Foreign Application Priority Data

Apr. 7, 2008 (CN) .......................... 2008 1 0089545

(51) Int. Cl.
*C30B 11/00* (2006.01)
(52) U.S. Cl. ................. 117/83; 117/73; 117/81; 117/82
(58) Field of Classification Search ..................... 117/83, 117/73, 80, 81, 82; 428/544
See application file for complete search history.

(56) References Cited

U.S. PATENT DOCUMENTS

| | | | |
|---|---|---|---|
| 4,209,189 A | 6/1980 | Betterley | |
| 4,300,297 A | 11/1981 | Betterley | |
| 4,722,376 A | 2/1988 | Rhyner | |
| 5,116,456 A | 5/1992 | Nestor | |
| D344,675 S | 3/1994 | Jacobson | |
| 5,427,832 A | 6/1995 | Longtin | |
| D368,428 S | 4/1996 | Croft | |
| 5,509,886 A | 4/1996 | Hill et al. | |
| 5,609,253 A | 3/1997 | Goade, Sr. | |
| 5,650,209 A | 7/1997 | Ramsburg et al. | |
| D385,488 S | 10/1997 | Smith et al. | |
| 5,720,158 A | 2/1998 | Goade, Sr. | |
| D394,387 S | 5/1998 | Williams | |
| 5,760,381 A | 6/1998 | Stich et al. | |
| 5,777,305 A | 7/1998 | Smith et al. | |
| 5,791,474 A | 8/1998 | Hansen | |
| 5,842,629 A | 12/1998 | Sprague et al. | |
| 5,918,909 A | 7/1999 | Fiala et al. | |
| 5,921,584 A | 7/1999 | Goade, Sr. | |
| 6,109,439 A | 8/2000 | Goade, Sr. | |
| 6,224,108 B1 | 5/2001 | Klure | |

(Continued)

FOREIGN PATENT DOCUMENTS

CN 1543518 11/2004

(Continued)

OTHER PUBLICATIONS

Machine Translation of Yamamoto, JP2004277266A, Oct. 2004, Japan.*

(Continued)

*Primary Examiner* — Matthew Song
(74) *Attorney, Agent, or Firm* — DLA Piper LLP (US)

(57) ABSTRACT

Systems and methods are disclosed for crystal growth using VGF and VB growth processes to reduce body lineage. In one exemplary embodiment, there is provided a method of inserting an ampoule with raw material into a furnace having a heating source, growing a crystal using a vertical gradient freeze process wherein the crystallizing temperature gradient is moved relative to the crystal and/or furnace to melt the raw material and reform it as a monocrystalline compound, and growing the crystal using a vertical Bridgman process on the wherein the ampoule/heating source are moved relative each other to continue to melt the raw material and reform it as a monocrystalline compound.

21 Claims, 4 Drawing Sheets

U.S. PATENT DOCUMENTS

| | | |
|---|---|---|
| 6,290,773 B1 | 9/2001 | Mizuniwa et al. |
| 6,290,796 B2 | 9/2001 | Furst et al. |
| 6,315,206 B1 | 11/2001 | Hansen et al. |
| 6,334,897 B1 * | 1/2002 | Asahi et al. ............ 117/81 |
| 6,349,829 B1 | 2/2002 | Matheis et al. |
| 6,418,648 B1 | 7/2002 | Hollingsworth et al. |
| 6,454,165 B1 | 9/2002 | Dawson |
| 6,493,970 B1 | 12/2002 | McCarthy et al. |
| 6,543,809 B1 | 4/2003 | Kistner et al. |
| 6,619,480 B2 | 9/2003 | Smith |
| 6,640,974 B2 | 11/2003 | Malone |
| 6,688,529 B1 | 2/2004 | Goade, Sr. |
| 6,773,035 B1 | 8/2004 | Cox et al. |
| 6,814,375 B2 | 11/2004 | Cox et al. |
| 6,896,729 B2 * | 5/2005 | Liu et al. ............ 117/81 |
| 6,902,518 B2 | 6/2005 | Bretl |
| D509,654 S | 9/2005 | Miller |
| 8,948,742 | 9/2005 | Buck |
| 6,957,737 B1 | 10/2005 | Frederickson et al. |
| 7,000,844 B1 | 2/2006 | Smith |
| 7,024,807 B2 | 4/2006 | Street |
| 7,040,665 B2 | 5/2006 | Ritchie et al. |
| 7,063,255 B2 | 6/2006 | Algiene |
| 7,083,086 B2 | 8/2006 | Whitaker |
| D531,021 S | 10/2006 | Ashby et al. |
| 7,188,762 B2 | 3/2007 | Goade, Sr. et al. |
| 7,204,048 B2 | 4/2007 | Kershner et al. |
| D541,647 S | 5/2007 | Ashby et al. |
| 7,219,829 B2 | 5/2007 | Treat |
| 7,222,797 B2 | 5/2007 | Davil et al. |
| 7,267,284 B1 | 9/2007 | Smith |
| 7,275,683 B2 | 10/2007 | Lazarowicz et al. |
| 2002/0100797 A1 | 8/2002 | Hollingsworth et al. |
| 2003/0037721 A1 * | 2/2003 | Liu et al. ............ 117/81 |
| 2003/0080013 A1 | 5/2003 | Smith |
| 2005/0017502 A1 | 1/2005 | Chariker |
| 2005/0223971 A1 * | 10/2005 | Wachi et al. ............ 117/223 |
| 2006/0151348 A1 | 7/2006 | Willard |
| 2006/0255154 A1 | 11/2006 | Newbrough et al. |
| 2006/0260536 A1 | 11/2006 | Wachi et al. |
| 2007/0045401 A1 | 3/2007 | Sturm |
| 2007/0045404 A1 | 3/2007 | Andersen et al. |
| 2007/0063052 A1 | 3/2007 | Chakiris et al. |
| 2007/0090184 A1 | 4/2007 | Lockwood et al. |
| 2007/0094901 A1 | 5/2007 | Kibbe et al. |
| 2007/0182155 A1 | 8/2007 | Duffy |
| 2007/0246527 A1 | 10/2007 | Tang |
| 2007/0246548 A1 | 10/2007 | Schultz et al. |
| 2007/0251994 A1 | 11/2007 | Kingsborough et al. |
| 2007/0262160 A1 | 11/2007 | Narlinger et al. |
| 2007/0278280 A1 | 12/2007 | Wert et al. |
| 2008/0116088 A1 | 5/2008 | Roberts |
| 2008/0116089 A1 | 5/2008 | Roberts |
| 2008/0311417 A1 * | 12/2008 | Eichler et al. ............ 428/544 |

FOREIGN PATENT DOCUMENTS

| | | |
|---|---|---|
| CN | 1873060 A | 12/2006 |
| JP | 2001-163694 A | 6/2001 |
| JP | 2004-277266 A | 10/2004 |

OTHER PUBLICATIONS

Machine Translation of Sawada, JP2001163694A, Jun. 2001, Japan.*

Bünger, et al., "Development of a Vertical Gradient Freeze Process for Low EPD GaAs Substrates," Materials Science and Engineering B Journal, vol. 80, No. 1-3, p. 5-9, Mar. 22, 2001, entire document, especially: p. 6, col. 2.

PCT International Search Report and Written Opinion dated Jan. 12, 2010 corresponding to the related PCT application PCT/US2009/60072.

First Office Action dated Jul. 14, 2011 in the corresponding CN application 200810089545.9 and English language translation thereof.

Second Office Action dated Feb. 2, 2012 in the corresponding CN application 200810089545.9 and English language translation thereof.

* cited by examiner

CRYSTAL GROWTH APPARATUS AND METHOD

CROSS REFERENCE TO RELATED APPLICATIONS

This application is based upon and claims the benefit of priority from the prior Chinese patent application No. 200810089545.9, filed Apr. 7, 2008.

BACKGROUND

1. Field

Systems and methods herein relate generally to the growth of Group III-V, II-VI and related monocrystalline compounds and in particular to a method and apparatus for growing such compounds with reduced body lineage.

2. Description of Related Information

Electronic and opto-electronic device manufacturers routinely require commercially grown, large and uniform single semiconductor crystals which, when sliced and polished, provide substrates for microelectronic device production. The growth of a semiconductor crystal involves heating polycrystalline raw material to its melting point (typically in excess of 1,200° C.) to create a polycrystalline raw material melt, bringing the melt into contact with a high quality seed crystal, and allowing the crystallization of the melt when in contact with the seed crystal. The crystallization of the melt forms an essentially cylindrical crystal (an ingot) along a vertical axis with the seed crystal below the polycrystalline raw materials. The equipment necessary to form the semiconductor crystal includes a crystal growth furnace, an ampoule, a crucible, and a crucible support. The crucible has a lower, narrow portion, called a seed well.

Drawbacks exist with the conventional crystal growth process and crystal growth equipment. For example, known crystal growth process creates a crystal that has body lineage defect which reduces the useful overall length of the crystal grown using the conventional crystal growth process. The reduction in the overall length of the grown crystal results in a lower yield. Accordingly, there is a need for a crystal growth apparatus and method that overcomes drawbacks such as these in known systems.

SUMMARY

Systems and methods consistent with the invention are directed to growth of moncrystalline compounds.

In one exemplary embodiment, there is provided a method of bringing an ampoule with raw material within a furnace having a heating source, growing a crystal using a vertical gradient freeze process wherein the crystallizing temperature gradient is moved relative to the crystal or furnace to melt the raw material and reform it as a monocrystalline compound, and growing the crystal using a vertical Bridgman process on the wherein the ampoule/heating source are moved relative each other to continue to melt the raw material and reform it as a monocrystalline compound.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

BRIEF DESCRIPTION OF THE DRAWINGS

The accompanying drawings, which constitute a part of this specification, illustrate various implementations and aspects of the present invention and, together with the description, explain the principles of the invention. In the drawings.

DETAILED DESCRIPTION OF ONE OR MORE EMBODIMENTS

Reference will now be made in detail to the invention, examples of which are illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

The apparatus and method are particularly applicable to an apparatus and method for gallium arsenide (GaAs) crystal growth and it is in this context that the apparatus and method are described. It will be appreciated, however, that the apparatus and method has greater utility since the apparatus and method can be used to produce other Group III-V, Group II-VI and related monocrystalline compounds.

Figure 1:
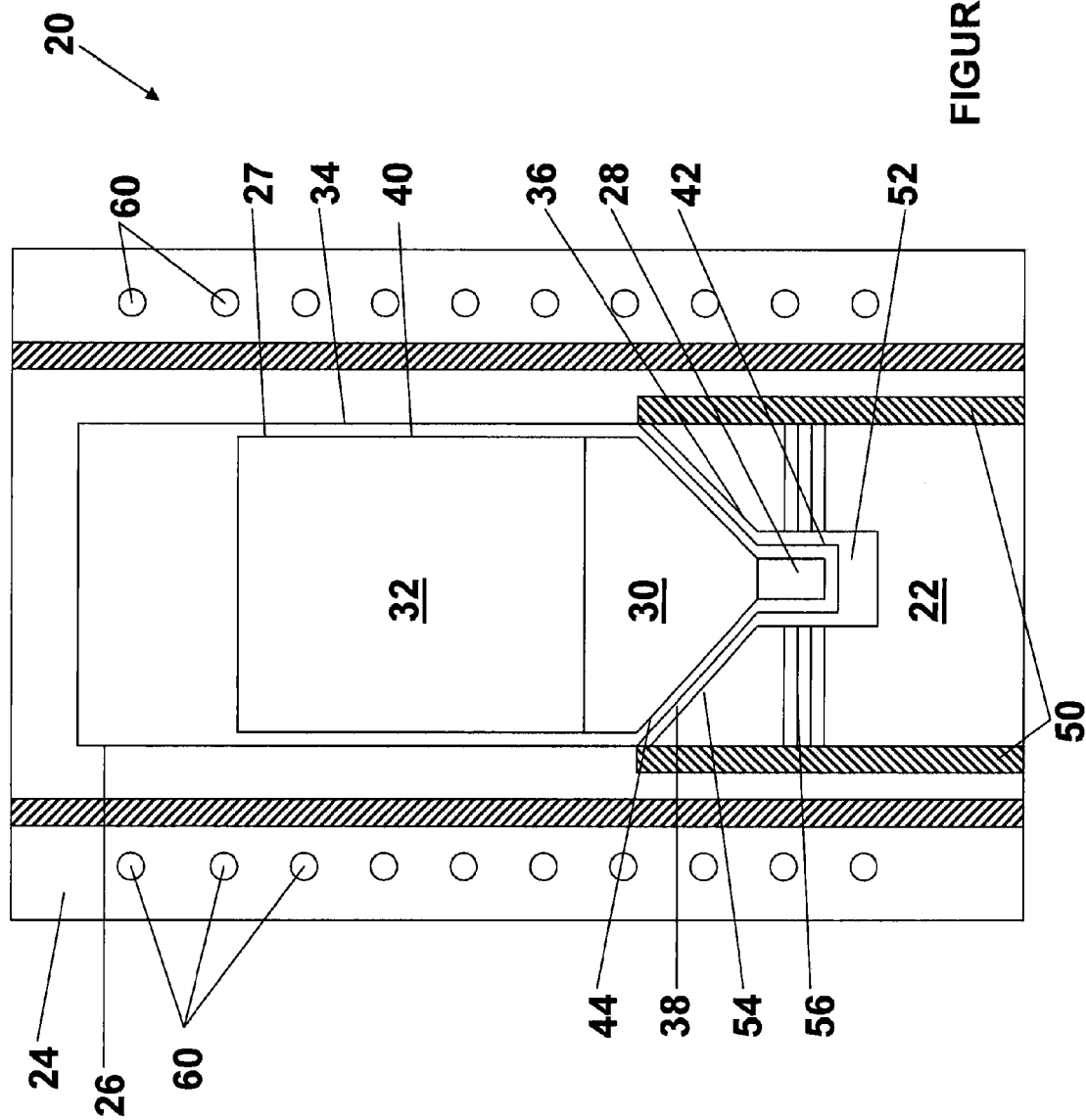
FIG. 1 is a cross sectional view of an exemplary crystal growth apparatus 20 consistent with certain aspects related to the innovations herein.

FIG. 1 is a cross sectional view of an example of a crystal growth apparatus 20. The apparatus may include a crucible support 22 in a furnace 24, such as a furnace that establishes a crystallizing temperature gradient which may be used in a vertical gradient freeze (VGF) or vertical Bridgman (VB) crystal growing and/or, if the furnace is moveable, a vertical Bridgman-Stockbarger process. The crucible support 22 provides physical support for and allows for thermal gradient control to an ampoule 26 (that in one implementation is made of quartz) that contains a crucible 27. The crucible support 22, when the furnace is in operation, can be moved during the crystal growth process. Alternatively, the crucible support is fixed and the furnace, when in operation, can be moved during the crystal growth process. The crucible 27 may contain a seed crystal 28, a grown monocrystalline crystal/compound 30 formed on top of the seed crystal and raw melt material 32. In one embodiment, the crucible 27 may be a pyrolitic boron nitride (pBN) material with a cylindrical crystal growth portion 34, a smaller diameter seed well cylinder 36 and a tapered transition portion 44. The crystal growth portion 34 has a diameter equal to the desired diameter of the crystal product. The current industry standard crystal diameters are 2 inch, 3 inch, 4 inch, 5 inch, 6 inch and 8 inch ingots that can be cut into wafers. At the bottom of the crucible 27, the seed well cylinder 36, in one implementation, may have a closed bottom and a diameter slightly larger than that of a high quality seed crystal 28, e.g., about 6-25 mm, and a length on the order of 30-100 mm. The cylindrical crystal growth portion 34 and the seed well cylinder 36 may have straight walls or may taper outwardly on the order of one to a few degrees to facilitate the removal of the crystal from the crucible 27. The tapered transition portion 38 between the growth portion 34 and the seed well cylinder 36 has an angled side wall pitched at, for example approximately 45-60 degrees, with a larger diameter equal to and connected to the growth zone wall and a narrower diameter equal to and connected to the seed well wall. The angled side wall may also be at other angles that are more steep or less steep than 45-60 degrees.

Before insertion in the crystal growth furnace 24, the crucible 27 is loaded with raw materials and inserted into the ampoule 26. The ampoule 26 may be made of quartz. The ampoule 26 has a shape similar to that of the crucible 27. The crucible is cylindrical in a crystal growth region 40, cylindrical with a narrower diameter in its seed well region 42 and has a tapered transition region 44 between the two regions. The crucible 27 fits inside the ampoule 26 with a narrow margin between them. The ampoule 26 is closed at the bottom of its seed well region 42 and, like the crucible, sealed on top after the crucible and raw materials are loaded. The bottom of the ampoule 26 has the same funnel shape as the crucible 27.

Since the ampoule-crucible combination has a funnel shape, the crucible support 22 is required to accommodate this funnel shape and hold the ampoule 26 stable and upright inside the furnace 24. In other implementations, the ampoule-crucible combination may retain different shapes, and the basic structure of the crucible support 22 would be changed accordingly to fit the specific different shape. According to an embodiment, the stability and strength to the ampoule and its contents are provided through a solid, thin-walled cylinder 50 of the crucible support 22. The solid, thin-walled cylinder 50 accommodates the funnel end of the ampoule structure 26. In one embodiment, the crucible support cylinder 50 is made of a heat conducting material, preferably quartz. In other embodiments, silicon carbide and ceramic may also be utilized to form the crucible support cylinder 50. The cylinder 50 makes a circle of contact with ampoule 26, where the upper rim of the cylinder 50 meets the shoulder of the ampoule's tapered region 38. Such configuration leads to minimal solid-to-solid contact which ensures that little or no undesirable, relatively uncontrollable heat conduction occurs. As a result, heating is able to be generated by other, more controllable processes.

A low density insulating material, such as ceramic fiber, fills the majority of the inside of the support cylinder 50 with only a hollow axial core 52 in approximately the center of the insulating material left empty to receive the seed well 42 of the ampoule 26. In other embodiments, the low-density insulating material may also comprise alumina fiber (1,800 degree. C.), alumina-silica fiber (1,426 degree. C.), and/or zirconia fiber (2,200 degree. C.). The insulating material is carefully placed in the crucible support 22. The weight of the ampoule 26, as it sits on top of the cylinder 50, pushes the insulating material down and forms the slanted insulating material edge 54. Filling the majority of the cylinder interior with a low-density insulator reduces the flow of air, which ensures that little or no undesirable, relatively uncontrollable convection flow will take place. Like conduction, convection is an uncontrollable heat transfer method that works to the detriment of the VGF and other crystal growth process.

The hollow core 52, with a diameter approximately equal to the ampoule seed well 42, extends downward to a small distance below the bottom of the ampoule seed well 42. In another embodiment, the hollow core 52 extends through the crucible support from the bottom of the seed well to the bottom of the furnace apparatus 24. The hollow core 52 provides a cooling path from the center of the crystal. It contributes to cooling in the seed well and in the center of the growing crystal. With this construction, heat energy can escape down through the center of the solid crystal and seed, down through this hollow core 52 in the insulating material within the crystal support 22. Without the hollow core 52, the temperature of the center of the cooling ingot would naturally be higher than the crystal material nearer to the outer surface. In this case, the center of the ingot in any horizontal cross section would crystallize later after its perimeter had solidified. Crystals with uniform electrical properties cannot be made under these conditions. With the creation of a hollow core 52 included in the crystal support method, heat energy is conducted down through the bottom of the ampoule 26 and the hollow core 52 from where it radiates back out of radiation channels 56. It is important to reduce heat energy from the center of the growing crystal so that the isothermal layers are kept flat across the crystal diameter. Maintaining a flat crystal-melt interface allows the production of crystals with uniform electrical and physical properties.

The low-density insulating material within the cylinder 50 obstructs the flow of heat radiation from a set of furnace heat elements 60 to the ampoule 26 in the seed well region 42, so this method requires the creation of a plurality of horizontal radiation channels/openings/tunnels 56 through the insulation material. The radiation channels 56 penetrate the insulating material to provide heat radiation outlets to controllably transfer heat from the furnace heating elements 60 to the ampoule seed well 42. The number, shape and diameter of the radiation channels 56 varies depending on specific conditions. The radiation channels may also be slanted, bent or wave-like. The radiation channels also do not necessary have to be continuous, as they may extend only partially through the insulating material. This helps minimize convection currents. In one embodiment, the diameter of these channels is small, on the order of a pencil width, so that convection airflow is insignificant. Larger holes with cross-sectional area on the order of a square inch or more can also be used according to other embodiments of the invention. The radiation channels 56 through the insulating material also work in conjunction with the hollow core 52 in the center of the insulating material to radiate heat energy drawn from the center of the crystal, and cool the crystal with planar isothermal temperature gradient layers. The radiation channels 56 enable temperature control and directly relate to crystal growth yield.

The furnace 24 as shown in FIG. 1 is an example of a furnace that may be used for both Vertical Gradient Freeze (VGF) and Vertical Bridgman (VB) or Vertical Bridgman-Stockbarger (VBS) crystal growth processes. Other furnaces may also be used. In the VGF crystal growth process the crystallizing temperature gradient within a heat source, which may itself be stationary, is being moved while the crystal is held stationary. In the VB crystal growth process, the heat source and its fixed crystallizing temperature gradient are kept stationary while the crystal is moved. In the VBS crystal growth process the heat source and its fixed crystallizing temperature gradient are moved while the crystal is kept stationary.

Figure 2:
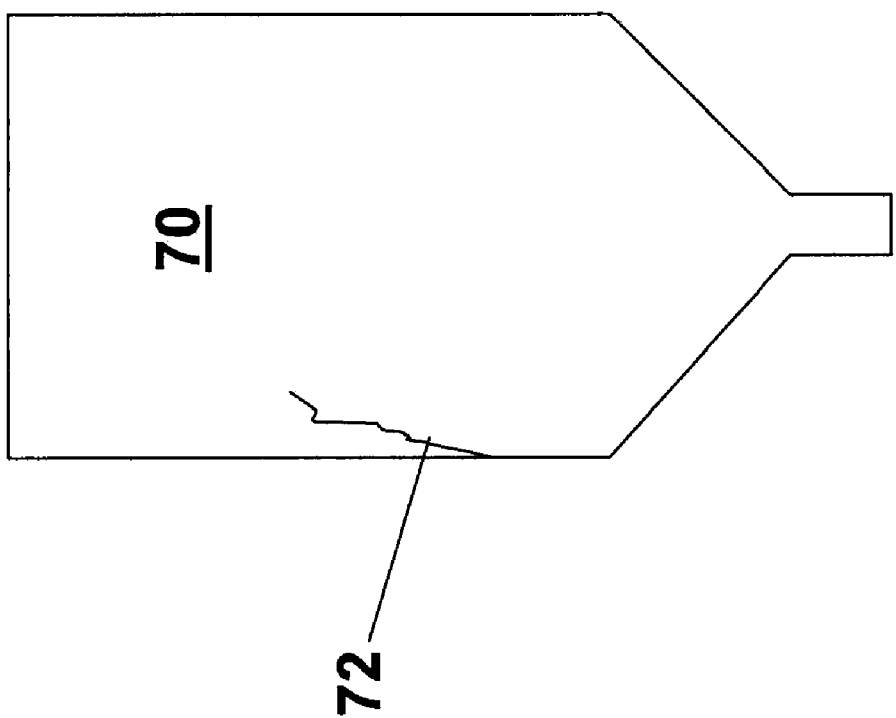
FIG. 2 illustrates an exemplary crystal ingot with body lineage consistent with certain aspects related to the innovations herein.

FIG. 2 illustrates a crystal ingot 70 with body lineage 72. As shown in FIG. 2, the body lineage is typically formed when crystal growth occurs in more than one different growth plane. When the body lineage occurs, the crystal at, and above, the body lineage is unusable and must be recycled.

Thus, the body lineage reduces the yield of the crystal growth process and it is desirable to reduce body lineage. Some furnaces and processes change the angle of the tapered portion of the furnace, but this does not solve the body lineage problems. A furnace and crystal growth process that overcomes this body lineage problem results in, for a given furnace, a longer length crystal which thus results in a larger yield.

Figure 3:
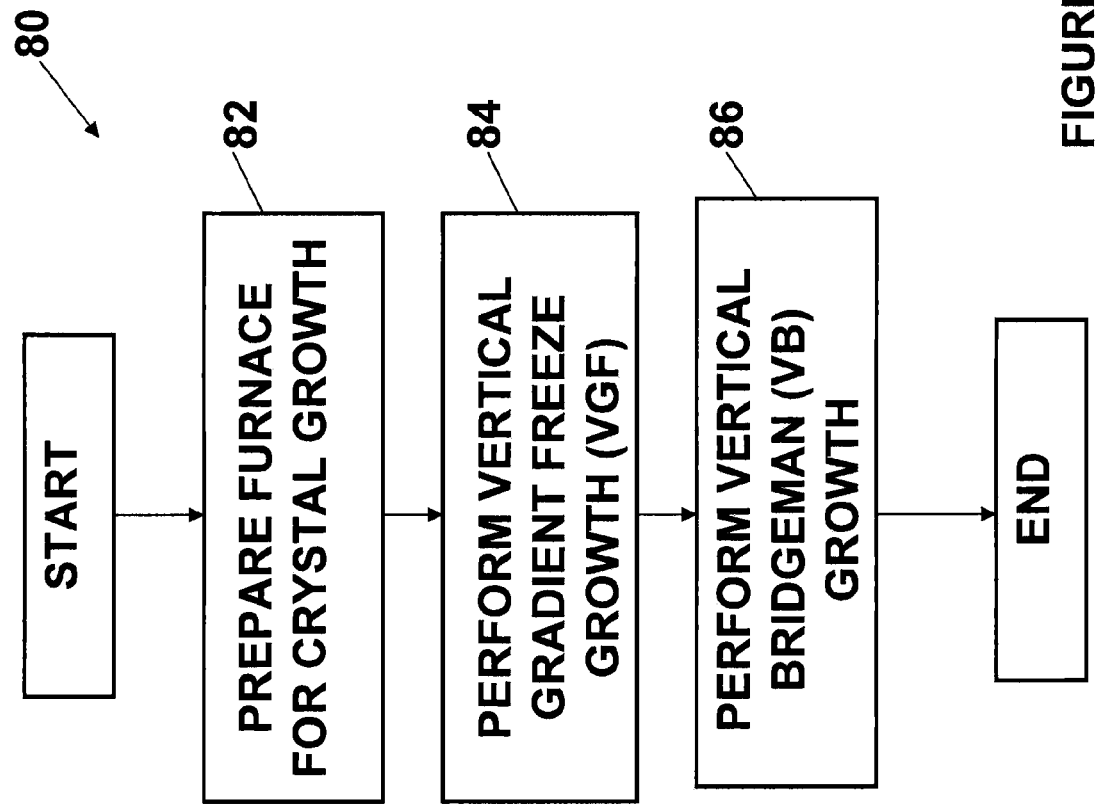
FIG. 3 illustrates an exemplary method for crystal growth using Vertical Gradient Freeze (VGF) and Vertical Bridgman (VB) process steps consistent with certain aspects related to the innovations herein.

FIG. 3 illustrates a method 80 for crystal growth using Vertical Gradient Freeze (VGF) and Vertical Bridgman (VB) process steps that reduce the body lineage resulting in longer crystals and higher yield. In the crystal growth process, the furnace is prepared for crystal growth (82) as described above. For the initial crystal growth from the seed, the VGF process (84) is used. At some point in the crystal growth process, the VB process (86) or the VBS process is used to complete the crystal growth. When the VB or VBS process is used, the melt/solid line is held at a level and then the process is continued with fixed conditions since the process changes typically required for VGF process as the volume decreases are not needed. In one implementation of the process, the VB process may be used at approximately 12-15 mm (½ inch) above the tapered region 38 as shown in FIG. 1. The combination of the VGF and VB processes results in longer crystals with fewer body lineage. The above method may be used with the furnace shown in FIG. 1, but may also be used with any other crystal growth furnace. The method may be used to grow crystals from 2 inch-6 inch, or larger, in diameter.

Figure 4:
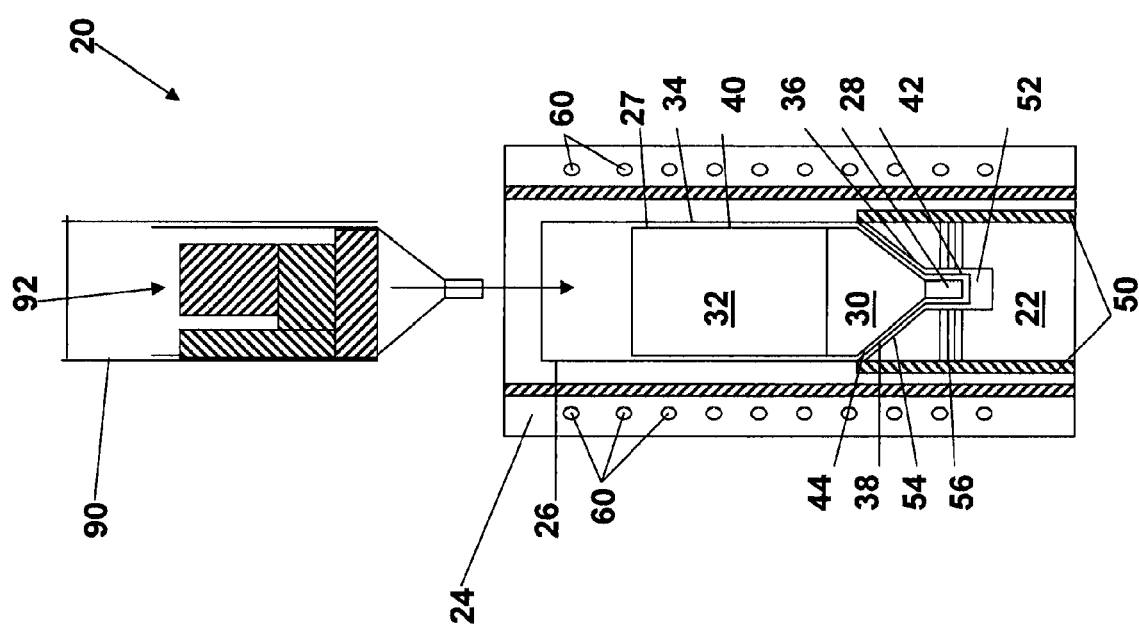
FIG. 4 illustrates an exemplary method for loading the crystal growth furnace shown in FIG. 1 consistent with certain aspects related to the innovations herein.

As shown in FIG. 4, a loading crucible 90 may be located above the crucible 27 and allows the crucible 27 to be loaded with more raw material. In particular, the raw gallium arsenide material 92 is solid and therefore cannot be tightly packed into the crucible 27 to be melted. Thus, the loading crucible is used to hold extra raw material that can be melted and then drain down into the crucible which results in a larger Gallium Arsenide charge in the crucible 27 which in turn results in a larger length Gallium Arsenide crystal. For example, about 65% of the raw material may be initially loaded into the loading crucible 90 and 35% of the raw material is loaded directly into the crucible 27. As a non-limiting example, the above method for loading the crystal growth furnace, a 15 kg charge may be loaded into the furnace that produces a 115 mm ingot with no lineage that results in 115 wafers.

Now, an example of the growth of a 6" (150 mm) diameter Gallium Arsenide grown using the above crystal growth furnace and method (VGF and VB combined) is described in more detail. To grow one exemplary crystal, the dimensions of the crucible were 150 mm diameter and 170 mm length crystal growth region 40. The diameter of the crucible in the seed well region 42 was 7 mm. In the example, 14 kg of GaAs polycrystalline material was loaded for un-doped GaAs ingot growth use. In operation, at first, the GaAs seed crystal is inserted in the bottom portion of the pBN crucible 27. Next, 14 kg of GaAs polycrystalline material, 100 g of boron trioxide as the liquid sealant are added therein. Then, the charge loaded pBN crucible was inserted in a quartz ampoule. The quartz ampoule was sealed under reduced pressure with a quartz cap. The quartz ampoule is then loaded in the furnace and placed on the crucible support.

Once the ampoule is loaded into the furnace, the quartz ampoule may be heated at the rate of approximately 270° C./hour. In one exemplary process, when the temperature reaches 27-28° C. over the melting point of Gallium Arsenide (1238° C.), the temperature point may be held until all of the polycrystalline Gallium Arsenide material melts (approximately 10 hours). Once the polycrystalline Gallium Arsenide material melt, a VGF method was first used for crystal growth. The temperature may then be reduced in the lower heating zone slowly to let crystal growth starting at the seed part begin and continue through the transition region until the crystal growth region cools at the cooling rate 0.3-0.47° C./hour while maintaining the temperature gradient from 1.2 to 1.8° C./cm.

According to this exemplary process, when the crystal has grown approximately one inch high in the crystal growth region, the VB process may be started. In the VB process, the crucible down speed is precisely controlled so as to get a cooling rate of 0.29° C./hour and a temperature gradient of from 1.8 to 5.2° C./cm. A resulting crystal of 81 mm length and high quality may be achieved via such a process, from a 105 mm long ingot, which is a crystal yield of 77%. The single crystal substrate from starting growth portion to end of growth portion may have a carrier concentration of 9.02E6/$cm^3$ to 5.30E6/$cm^3$ and a resistivity of 1.33E8 $\Omega$.cm to 1.64E8 $\Omega$.cm. Further, the dislocation density may be 3000/$cm^2$ at the starting portion and 5000/$cm^2$ at the end of growth portion. It is well known in the art that one can, by making suitable changes to the various system parameters, operate the process in regimes beyond those demonstrated explicitly in the embodiments.

While the foregoing has been with reference to a particular embodiment of the invention, it will be appreciated by those skilled in the art that changes in this embodiment may be made without departing from the principles and spirit of the invention, the scope of which is defined by the appended claims.

The invention claimed is:

1. A method for crystal growth, comprising:
 inserting an ampoule with a crucible having a seed and raw material into a furnace having a heating source, the crucible having a crystal growth region, a seed well region with a narrower diameter than that of the crystal growth region and a tapered crystal growth region between the crystal growth region and the seed well region, the tapered crystal growth region having sidewalls tapered at an angle of 45-60 degrees;
 positioning the crucible above a crucible support cylinder that supports the crucible, the a crucible support cylinder having a funnel shape matching the tapered crystal growth region with sidewalls tapered at an angle of 45-60 degrees, such that the crucible support cylinder makes circular contact with the ampoule via only an upper rim that meets a shoulder of the tapered crystal growth region to minimize solid-to-solid contact between the crucible support cylinder and the ampoule and thereby minimize undesired/uncontrollable heating of the ampoule via conduction heating occurring therebetween, such that heat conductivity between the seed well region to an outer perimeter of the crucible support is higher than heat conductivity between an outer perimeter of the tapered crystal growth region to the crucible support, and wherein the crucible support is filled in the majority of the inside with a low density insulating material and has radiation channels penetrate from the crucible support cylinder to the seed well region, which reduces the flow of air in the crucible support and thereby minimizes undesired/uncontrollable heating of the ampoule via convection heating associated with the crucible support;
 growing a crystal using a vertical gradient freeze (VGF) process wherein the crystallizing temperature gradient within a heating source is moved relative to the crucible which is stationary to melt the raw material and reform it as a monocrystalline compound;

controlling the heating source and the crucible support to perform monocrystalline crystal growth and to transition, at a predetermined crystal growth length of about 12-15 mm above the tapered growth region, to a crystal growth using a vertical Bridgman process on the crucible wherein the crucible is moved relative to the heating source which is stationary to continue to melt the raw material and reform it as a monocrystalline compound; and growing, at a predetermined crystal growth length, the crystal using a vertical Bridgman (VB) process on the ampoule in the furnace wherein the ampoule is moved relative to the heating source which is stationary to continue to melt the raw material and reform it as a monocrystalline compound;

wherein, as a function of (1) the controlled heating of the raw material provided by the heating source and the controller during the VGF and VB processes combined with (2) the reduction of conduction heating and convection heating between the crucible support cylinder and the ampoule, accurate control of crystallizing temperature gradients are provided during VGF growth, during transition from VGF to VB, and during VB growth such that 6" GaAs single-crystal ingots of at least 105 mm length are reproducibly achieved having reduced body lineage defects characterized via yields of greater than 75%.

2. The method of claim 1 wherein the heating source is a stationary heating source.

3. The method of claim 2 further comprising producing a crystal ingot having no body lineage.

4. The method of claim 2, wherein growing the crystal using the vertical gradient freeze process further comprising growing the crystal at a cooling rate of about 0.1 to about 10.0° C./hour and at a temperature gradient of between about 0.5 and about 10.0° C./cm.

5. The method of claim 2, wherein growing the crystal using the vertical Bridgman process further comprises growing the crystal at a cooling rate of about 0.1 to about 10.0° C./hour and a temperature gradient from about 0.5 to about 10.0° C. /cm.

6. The method of claim 2 further comprises loading, using a loading crucible, a loading charge of raw Gallium Arsenide material into the crucible to provide a larger amount of raw Gallium Arsenide material to the crucible.

7. The method of claim 1 further comprising producing a crystal ingot having no body lineage.

8. The method of claim 7 further comprises loading, using a loading crucible, a loading charge of raw Gallium Arsenide material into the crucible to provide a larger amount of raw Gallium Arsenide material to the crucible.

9. The method of claim 8 further comprising producing a crystal ingot having no body lineage.

10. The method of claim 1, wherein growing the crystal using the vertical gradient freeze process further comprising growing the crystal at a cooling rate of about 0.1 to about 10.0° C./hour and at a temperature gradient of between about 0.5 and about 10.0° C./cm.

11. The method of claim 10 further comprising producing a crystal ingot having no body lineage.

12. The method of claim 10, wherein growing the crystal using the vertical Bridgman process further comprises growing the crystal at a cooling rate of about 0.1 to about 10.0° C./hour and a temperature gradient from about 0.5 to about 10.0° C./cm.

13. The method of claim 1 further comprises loading, using a loading crucible, a loading charge of raw Gallium Arsenide material into the crucible to provide an increased quantity of raw Gallium Arsenide material in the crucible under vacuum seal given as the sum of raw material from both the crucible and the loading crucible.

14. The method of claim 1, wherein growing the crystal using the vertical Bridgman process further comprises growing the crystal at a cooling rate of about 0.1 to about 10.0° C./hour and a temperature gradient from about 0.5 to about 10.0° C./cm.

15. The method of claim 14 further comprising producing a crystal ingot having no body lineage.

16. A method for crystal growth, comprising:

inserting an ampoule with a crucible having a seed and raw material into a furnace having a heating source, the crucible having a crystal growth region, a seed well region with a narrower diameter than that of the crystal growth region and a tapered crystal growth region between the crystal growth region and the seed well region, the tapered crystal growth region having sidewalls tapered at an angle of 45-60 degrees;

positioning the crucible above a crucible support cylinder that supports the crucible, the a crucible support cylinder having a funnel shape matching the tapered crystal growth region with sidewalls tapered at an angle of 45-60 degrees, such that the crucible support cylinder makes circular contact with the ampoule via only an upper rim that meets a shoulder of the tapered crystal growth region to minimize solid-to-solid contact between the crucible support cylinder and the ampoule and thereby minimize undesired/uncontrollable heating of the ampoule via conduction heating occurring therebetween, such that heat conductivity between the seed well region to an outer perimeter of the crucible support is higher than heat conductivity between an outer perimeter of the tapered crystal growth region to the crucible support, and wherein the crucible support is filled in the majority of the inside with a low density insulating material and has radiation channels penetrate from the crucible support cylinder to the seed well region, which reduces the flow of air in the crucible support and thereby minimizes undesired/uncontrollable heating of the ampoule via convection heating associated with the crucible support;

growing a crystal using a vertical gradient freeze (VGF) process wherein the crystallizing temperature gradient within the stationary heating source is moved relative to the crucible which is stationary to melt the raw material and reform it as a monocrystalline compound;

controlling the heating source and the crucible support to perform monocrystalline crystal growth and to transition, at a predetermined crystal growth length of about 12-15 mm above the tapered growth region, to a crystal growth using a vertical Bridgman-Stockbarger process on the crucible wherein the crucible is moved relative to the heating source which is stationary to continue to melt the raw material and reform it as a monocrystalline compound; and growing, at a predetermined crystal growth length, the crystal using a vertical Bridgman-Stockbarger (VBS) process on the ampoule in the furnace wherein the heating source containing the crystallizing temperature gradient is moved relative to the ampoule which is stationary to continue to melt the raw material and reform it as a monocrystalline compound;

wherein, as a function of (1) the controlled heating of the raw material provided by the heating source and the controller during the VGF and VBS processes combined with (2) the reduction of conduction heating and convection heating between the crucible support cylinder and the ampoule, accurate control of crystallizing temperature gradients are provided during VGF growth, during transition from VGF to VB, and during VB growth such that 6" GaAs single-crystal ingots of at least 105 mm length are reproducibly achieved having reduced body lineage defects characterized via yields of greater than 75%.

17. The method of claim 16, wherein the furnace has a tapered crystal growth region and wherein the predetermined crystal growth length is about 0.25 to about 50 mm above the tapered crystal growth region.

18. The method of claim 17 further comprising producing a crystal ingot having no body lineage.

19. The method of claim 16, wherein growing the crystal using the vertical gradient freeze process further comprising growing the crystal at a cooling rate of about 0.1 to about 10.0° C./hour and at a temperature gradient of between about 0.5 to about 10.0° C./cm.

20. The method of claim 19, wherein growing the crystal using the vertical Bridgman-Stockbarger process further comprises growing the crystal at a cooling rate of about 0.1 to about 10.0° C./hour and a temperature gradient from about 0.5 to about 10.0° C./cm.

21. The method of claim 16 further comprises loading, using a loading crucible, a loading charge of raw Gallium Arsenide material into the crucible to provide an increased quantity of raw Gallium Arsenide material in the crucible under vacuum seal given as the sum of raw material from both the crucible and the loading crucible.

* * * * *